United States Patent [19]

Nogami et al.

[11] Patent Number: 5,122,438

[45] Date of Patent: Jun. 16, 1992

[54] METHOD FOR DEVELOPING A WATERLESS LIGHT-SENSITIVE LITHOGRAPHIC PLATE

[75] Inventors: Akira Nogami, Hino; Masafumi Uehara, Kokubunji; Kazuhiro Shimura, Ome, all of Japan

[73] Assignee: Konica Corporation, Tokyo, Japan

[21] Appl. No.: 601,388

[22] Filed: Oct. 23, 1990

[30] Foreign Application Priority Data

Nov. 2, 1989 [JP] Japan ................. 1-287107
Nov. 3, 1989 [JP] Japan ................. 1-286957

[51] Int. Cl.⁵ .................................. G03F 7/32
[52] U.S. Cl. .................... 430/303; 430/309; 430/331
[58] Field of Search .............. 430/303, 331, 309

[56] References Cited

U.S. PATENT DOCUMENTS

| | | | |
|---|---|---|---|
| 4,130,425 | 12/1978 | Boyd et al. | 430/331 |
| 4,186,006 | 1/1980 | Kabayashi et al. | 430/331 |
| 4,350,756 | 9/1982 | Burch et al. | 430/331 |
| 4,378,423 | 3/1983 | Suezawa et al. | 430/303 |
| 4,395,480 | 7/1983 | Sprintschnik | 430/309 |
| 4,579,811 | 4/1986 | Schell et al. | 430/331 |
| 4,874,686 | 10/1989 | Urabe et al. | 430/272 |
| 4,963,472 | 10/1990 | Schlosser et al. | 430/303 |

FOREIGN PATENT DOCUMENTS 0067001 12/1982 European Pat. Off.
0279630 2/1987 European Pat. Off.

*Primary Examiner*—Marion E. McCamish
*Assistant Examiner*—Kathleen Duda
*Attorney, Agent, or Firm*—Finnegan, Henderson, Farabow, Garrett and Dunner

[57] ABSTRACT

A method of developing a waterless light-sensitive lithographic printing plate having a support and, provided thereon, a light-sensitive layer comprising a diazo resin and a silicone gum layer with a developer is disclosed. The developer comprises an organic carboxylic acid or salt thereof, water, and at least one of a sulfite and a surfactant.

17 Claims, No Drawings

METHOD FOR DEVELOPING A WATERLESS LIGHT-SENSITIVE LITHOGRAPHIC PLATE

FIELD OF THE INVENTION

This invention relates to a method of developing a waterless light-sensitive lithographic plate and, more particularly, to a method of developing a waterless light-sensitive lithographic plate, which is high in development rate, low in environmental pollution, odor production and inflammability and excellent in safety.

BACKGROUND OF THE INVENTION

There have so far been well-known waterless light-sensitive lithographic plates including, for example, those comprising each a support coated thereon with a light-sensitive layer and an ink-repellent layer in order.

This type of waterless light-sensitive lithographic plates are developed after they are exposed imagewise to light. The developers applicable thereto include, for example, the organic solvent type developers such as those detailed in Japanese Patent Examined Publication No. 54-26923/1979, with which waterless light-sensitive lithographic plates are developed.

When using this type of the developer, the developments may be made at a satisfactory development rate on one hand, however, there raise the problems of inflammability, safety, or environmental pollution caused by the organic solvents on the other hand.

In the meantime, as for the developers prepared by taking the inflammability, safety and hygiene into consideration, the well-known aqueous type developers including those described in, for example, Japanese Patent Publication Open to Public Inspection -hereinafter referred to as Japanese Patent O.P.I. Publication- Nos. 60-140243/1985 and 61-275759/1986. The techniques described therein are low in inflammability and excellent in safety because the developers contain water. However, these developers have the problem that the development efficiency is seriously deteriorated especially when processing a great number of plate materials with an automatic processor, because the development rate thereof is not high enough.

The present inventors have seriously studied on the above-mentioned problems and, resultingly, they have discovered that the problems can be solved by containing an organic carboxylic acid and at least one of a sulfite and a surfactant.

SUMMARY OF THE INVENTION

It is, therefore, an object of the invention to provide a method of developing a waterless light-sensitive lithographic plate, which is high in development rate, low in environmental pollution, odor production and inflammability, and excellent in safety.

DETAILED DESCRIPTION OF THE INVENTION

The above-mentioned object of the invention can be achieved in a method of developing a waterless light-sensitive lithographic printing plate having a support and, provided thereon, a light-sensitive layer comprising a diazo resin and a silicone gum layer with a developer, wherein said developer comprises an organic carboxylic acid or salt thereof, water, and at least one of a sulfite and a surfactant.

The invention will now be detailed below.

The components of the developers applicable to the invention for developing waterless light-sensitive lithographic plates include an organic carboxylic acid, a sulfite and/or a surfactant. The components thereof will be detailed.

The organic carboxylic acid applicable to the invention includes, preferably an aliphatic or aromatic carboxylic acid having 6 to 20 carbon atoms.

The typical examples of the aliphatic carboxylic acids each having 6 to 20 carbon atoms include caproic acid, enanthylic acid, caprylic acid, pelargonic acid, capric acid, lauric acid, mistylic acid, palmitic acid, and stearic acid. Among them, the particularly preferable examples thereof include an alkane acid having 8 to 12 carbon atoms. Besides, either an aliphatic acid having a double bond in the carbon chain thereof or those having a branched carbon chain may also be used.

The above-given aliphatic carboxylic acids should preferably be used in the form of the sodium, potassium or ammonium salts thereof so that the water-solubility of the aliphatic carboxylic acids may be enhanced.

The aromatic carboxylic acids include the compounds having a benzene ring, a naphthalene ring or an anthracene ring substituted with an carboxyl group. The typical examples of the compounds include benzoic acid, o-chlorobenzoic acid, p-o-chlorobenzoic acid, o-hydroxybenzoic acid, p -hydroxybenzoic acid, o-aminobenzoic acid, p-aminobenzoic acid, 2,4-dihydroxybenzoic acid, 2,5-dihydroxybenzoic acid, 2,6-dihydroxybenzoic acid, 2,3-dihydroxybenzoic acid, 3,5-dihydroxybenzoic acid, gallic acid, 1-hydroxy-2-naphthoic acid, 3-hydroxy-2-naphthoic acid, 2-hydroxy-1-naphthoic acid, 1-naphthoic acid and 2-naphthoic acid. Among them, an aromatic carboxylic acid is particularly useful. The abovegiven aromatic carboxylic acids should preferably be used in the form of the sodium, potassium or ammonium salts thereof so that the water-solubility thereof can be enhanced.

The organic carboxylic acids or salts thereof should be added into the developers of the invention, in an amount within the range of, preferably, 0.1 wt% to 10 wt% and, preferably, 0.5 wt% to 4 wt%.

The sulfite usefully applicable to the invention includes, for example, sodium sulfite, potassium sulfite, lithium sulfite and ammonium sulfite.

The sulfite is contained in the developer in an amount within the range of 0.1 to 10% by weight.

The surfactant preferably useful includes, for example, an anionic or nonionic surfactant.

The anionic surfactant includes, for example; a higher alcohol having $C_8$ to $C_{22}$; sulfates such as sodium lauryl alcohol sulfate, sodium cetyl alcohol sulfate, ammonium lauryl alcohol sulfate, 'T-Pole B-81', a brand-name, manufactured by Shell Chemical Co., and secondary sodium alkylsulfate; aliphatic alcohol phosphates such as the sodium salts of cetyl alcohol phosphate; alkylaryl sulfonates such as sodium dodecylbenzene sulfonate, sodium isopropylnaphthalene sulfonate, sodium dinaphthalene sulfonate and sodium metanitrobenzene sulfonate; alkylamide sulfonates such as

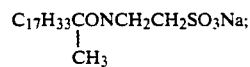

and the sulfonic acid salts of dibasic aliphatic acid esters, such as sodium sulfosuccinic acid dioctyl ester and sodium sulfosuccinic acid dihexyl ester. Among them, the sulfonic acid salts should preferably be used in particular.

The content of the anionic surfactant is within the range of 1 wt% to 30 wt% and, preferably, 3 wt% to 15 wt%, each to the whole amount of a developer used.

Various types of the nonionic surfactants may be used therein.

In other words, the nonionic surfactants may roughly be classified into two types, namely, a polyethylene glycol and a polyhydric alcohol. In the invention, any one of these two types of them may be used. From the viewpoint of obtaining a greater effect, a polyethylene glycol is preferably used as a nonionic surfactant.

Among them, it is preferable to use a nonionic surfactant having three or more ethylene oxide groups, i.e., —$CH_2CH_2O$—groups, and a value of hydrophilic lipophile balance, abbreviated to HLB, of 5 to 20 and, preferably, 8 to 20.

Among the nonionic surfactants, those having both of an ethyleneoxy group and a propylene oxide group are particularly preferable. Further, among them, those having an HLB value of 8 to 20 preferable.

The preferable examples of the nonionic surfactants applicable to the invention include the compounds represented by the following formulas 1 through 8.

Formula 1

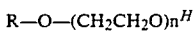

Formula 2

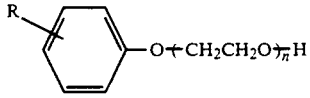

Formula 3

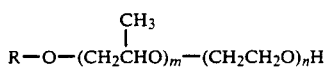

Formula 4

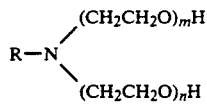

Formula 5

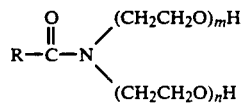

Formula 6

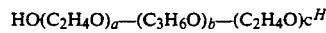

Formula 7

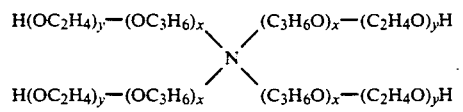

Formula 8

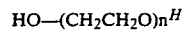

In Formulas 1 through 8, R represents a hydrogen atom or a monovalent organic group. The organic groups include, for example; an alkyl group which may have a straight-chained or branched substituent having 1 to 30 carbon atoms, such as an aryl group, e.g., a phenyl group; an alkylcarbonyl group comprising an alkyl component that is the above-mentioned alkyl group; and a phenyl group which may have a substituent such as a hydroxyl group or such an alkyl group as mentioned above.

In the above-given formulas, a, b, c, m, n, x and y are each an integer of 1 to 40.

Now, the typical examples of the non-ion type surfactants applicable to the invention will be given below.

Namely, polyethylene glycol, polyoxyethylene lauryl ether, polyoxyethylene nonyl ether, polyoxyethylene cetyl ether, polyoxyethylene stearyl ether, polyoxyethylene behenyl ether, polyoxyethylene polyoxypropylene cetyl ether, polyoxyethylene polyoxypropylene behenyl ether, polyoxyethylene nonylphenyl ether, polyoxyethylene octylphenyl ether, polyoxyethylene stearyl amine, polyoxyethylene oleyl amine, polyoxyethylene stearic acid amide, polyoxyethylene oleic acid amide, polyoxyethylene castor oil, polyoxyethylene abietic ether, polyoxyethylene lanolin ether, polyoxyethylene monolaurate, polyoxy ethylene monostearate, polyoxy ethylene glyceryl monoaurate, polyoxyethylene glycermonostearate, polyoxyethylene propyleneglycol monostearate, oxyethyleneoxypropylene block polymer, distyrenophenol polyethylene oxide adduct, tribenzylphenol polyethylene oxide adduct, octylphenol polyoxyethylene polyoxypropylene adduct, glycerol monostearate, sorbitan monolaurate, and polyoxyethylene sorbitan monolaurate.

The weight average molecular weight of the non-ion type surfactants applicable to the invention is within the range of, preferably, 300 to 10000 and, particularly, 500 to 5000. The concentration of the non-ion type surfactants in a developer is within the range of 0.001 to 20 wt%. When it is less than 0.001 wt%, any noticeable effects can be obtained. The particularly preferable concentration of the non-ion type surfactants on as developer is within the range of 0.1 to 10 wt%.

The non-ion type surfactants may be used independently or in combination.

In the invention, sulfites and the surfactants may be used independently or in combination.

The water-contents thereof is within the range of 20 wt% to 97 wt% and, preferably, 50 wt% to 95 wt%.

As the developers applicable to the invention, an alkaline aqueous type developers may preferably be used. The pH values of the developers are not lower than 10 and, preferably, within the range of pH 11.5 to 13.0.

For the purpose of making the developers alkaline to have a pH of not lower than 10, it is allowed to use, for example; silicates such as sodium silicate and potassium silicate; inorganic alkali agents such as potassium hydroxide, sodium hydroxide, lithium hydroxide, tertiary sodium phosphate, secondary sodium phosphate, tertiary potassium phosphate, secondary potassium phosphate, tertiary ammonium phosphate, secondary ammonium phosphate, sodium metasilicate, sodium bicarbonate, sodium carbonate, potassium carbonate, and ammonium carbonate; organic alkali agents such as a mono- or di-triethanolamine and tetraalkyl hydroxide; and organic ammonium silicate. Among them, silicates are preferably used.

Silicates are contained in an amount within the range of 0.1 to 20% by weight in the developer of the invention.

It is preferable that the developers of the invention further contain an organic solvent in a proportion within the range of 0.1 to 20 wt%.

The preferable organic solvents include at least one selected from the group consisting of alcohols such as methanol, ethanol and benzyl alcohol; amines such as methylamine, ethylamine and diethanolamine; ethylene glycols such as diethylene glycol and triethylene glycol; and propylene glycols such as α-propylene glycol and β-propylene glycol. Benzyl alcohol or propylene glycol is more preferable.

To the developers applicable to the invention, the following additives may be added; namely, neutral salts such as NaCl, KCl and KBr each described in Japanese Patent O.P.I. Publication No. 58-75152/1983; chelating agents such as EDTA and NTA each described in Japanese Patent O.P.I. Publication No. 58-190952/1983; Complexes such as $[CO(NH_3)_6]Cl$ and $COCl_2 \cdot 6H_2O$ each described in Japanese Patent O.P.I. Publication No. 59-121336/1984; anionic or amphoteric surfactants such as sodium alkylnaphthalene sulfonate and N-tetradecyl-N,N-dihydroxyethyl betaine each described in Japanese Patent O.P.I. Publication No. 50-51324/1975; non-ion type surfactants such as tetramethyl decynediol described in U.S. Pat. No. 4,374,920; cationic polymers such as quaternary methyl chloride compounds of p-dimethylaminomethyl polystyrene described in Japanese Patent O.P.I. Publication No. 55-95946/1980; amphoteric high molecular electrolytes such as a copolymer of vinylbenzyltrimethyl ammonium chloride and sodium acrylate described in Japanese Patent O.P.I. Publication No. 56-142528/1981; reducible inorganic salts such as sodium sulfite described in Japanese Patent O.P.I. Publication No. 57-192952/1982; Inorganic lithium compounds such as lithium chloride described in Japanese Patent O.P.I. Publication No. 58-59444/1983; organic lithium compounds such as lithium benzoate described in Japanese Patent Examined Publication No. 50-34442/1975; organic metal surfactants each containing silica or titanium described in Japanese Patent O.P.I. Publication No. 59-75255/1984; organic boron compounds described in Japanese Patent O.P.I. Publication No. 59-84241/1984; and quaternary ammonium salts such as tetraalkyl ammonium oxide described in European Patent No. 101010.

In the light-sensitive layers suitably treated with the developers of the invention, a diazo compound is used.

In the invention, the following diazo compounds may be used. For example, they include, typically, diazo resins such as a condensate of an aromatic diazonium salt and formaldehyde and, particularly, the salts of the condensate of p-diazodiphenylamine and formaldehyde or acetaldehyde; such as the inorganic salts of diazo resin which are the reacted products of the above-mentioned condensates and a hexafluorophosphate, a tetrafluoroborate, a perchlorate or a periodate; and the organic salts of diazo resin which are the reacted products of the above-mentioned condensates and sulfonic acids, such as those described in U.S. Pat. No. 3,300,309. It is preferable that the diazo resins are used together with a binder. As for the binders, various kinds of high molecular compounds may be used. They include, preferably, copolymers obtained by copolymerization of monomers having an aromatic hydroxyl group such as those described in Japanese Patent O.P.I. Publication No. 54-98613/1979 with other monomers. The monomers having an aromatic hydroxyl group include, for example; N-(4-hydroxyphenyl)methacrylamide, N-(4-hydroxyphenyl)methacrylamide, o-, m- or p-hydroxystyrene, or o-, m- or p-hydroxyphenyl methacrylate; polymers each containing a hydroxyethyl acrylate unit or a hydroxyethyl methacrylate unit as the main repetition unit thereof, natural resins such as shellac and rosin, and polyvinyl alcohol, each described in U.S. Pat. No. 4,123,276; polyamide resins such as those described in U.S. Pat. No. 3,751,257; linear polyurethane resins, phthalate resins of polyvinyl alcohol, epoxy resins condensed with Bisphenol A and epichlorohydrin, and cellulose such as cellulose acetate and cellulose acetatephthalate, each described in U.S. Pat. No. 3,660,097.

The light-sensitive layers contain, besides the above, the following dyes and substances; namely, the dyes for visualizing an image after an exposure or development is made, including the triphenyl methane type or the diphenyl methane type dyes such as Victoria Pure Blue BOH manufactured by Hodogaya Chemical Industries Co. and Oil Blue #603 manufactured by Orient Chemical Industries Co.; and the substances capable of producing an acid upon making an exposure to light, i.e., the photochemical acid producers, including light-sensitive diazo compounds, o-naphthoquinone diazide compounds and the aromatic compounds each having a trihalomethyl group such as an oxadiazole compound having a trihalomethyl group and a s-triazine compound having a trihalomethyl group. For further details thereof, refer to Japanese Patent O.P.I. Publication No. 62-112162/1987.

The light-sensitive layers are further allowed to contain, for example; alkyl ether such as ethyl cellulose and methyl cellulose, fluorine type surfactants and ninionic type surfactants such as PLURONIC L64 manufactured by Asahi Electrochemical Industries Co., each for improving the coatability of the layers; plasticizers such as polyethylene glycol, tricresyl phosphate and acrylic acid or methacrylic acid polymers; and stabilizers such as phosphoric acid.

The silicone rubbers applicable to the invention include, preferably, those having each linear organic polysiloxane as the main component, a hydroxyl group in the principal chain having a molecular weight of tens of hundreds to hundreds of thousands and the repetition unit represented by the following formula I, or at the end of the principal chain.

Formula I

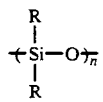

wherein n is an integer of not less than 2; and R represents an alkyl group having 1 to 10 carbon atoms, a halogenoalkyl group, an alkoxyl group, a vinyl group, an aryl group or a silanol group, i.e., an OH group; provided, not less than 60% of R is preferable to be a methyl group. In the formula, the silanol group, i.e., the OH group, may be attached to either inside or the end of the principal chain, provided, it is preferable that the silanol group is attached to the end of the principal chain.

The silane coupling agents or the silicone cross coupling agents applicable to the invention are the silane compounds represented by the following formula:

wherein n is an integer of 1 to 3; R represents an alkyl group, an aryl group, an alkenyl group, or the monovalent group combined thereof, provided, these groups may have a functional group such as those of halogen, amine, hydroxy, alkoxy, aryloxy and thiol; X represents a substituent such as those of $-OH$, $-OR^2$, $-OAc$,

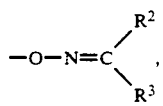

H each the same as the above-denoted R, and $R^2$ and $R^3$ may be the same with or the different from each other; and Ac represents an acetyl group.

In other words, the silicone rubber useful in the invention can be obtained through the condensation reaction of the silicone base polymer with a silicone cross coupling agent such as those given above.

The silane coupling agents applicable to the invention include, typically, HN (CH$_2$)$_3$Si(OMe)$_3$]$_2$, vinyltriethoxysilane, Cl(CH$_2$)$_3$Si(OMe)$_3$, CH$_3$Si(OAc)$_3$, HS(CH$_2$)$_3$Si(OMe)$_3$, and vinyltris(methylethylketooxime)silane.

The above-mentioned silicone rubber are available on the market as commercial articles such as YE-3085 manufactured by Toshiba Silicone Co. The other useful silicone rubber may be obtained through the reaction of the foregoing base polymer with silicone oil having a repetition unit represented by the following formula II, the addition reaction thereof with a silicone base.-polymer in which about 3% of R is a vinyl group, or the reaction of the silicone oil with each other.

Formula II

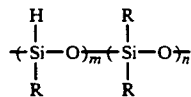

wherein R is synonymous with R representing the substituent of the polymers in Formula I; m is an integer of not less than 2; and n is an integer of 0 or not less than 1.

For obtaining the silicone rubber through the cross coupling reaction such as mentioned above, the cross coupling reaction is carried out with a catalyst. The catalysts applicable thereto include, for example, the organic carboxylates of metals such as tin, zinc, cobalt, lead, calcium and manganese. To be more concrete, tin dibutyllaurate, tin(II) octate or cobalt naphthenate, or chloroauric acid.

For the purpose of obtaining a silicone rubber having a resistance against friction produced in printing operations by improving the strength of the silicone rubber, a filler may be mixed in. Silicone rubber mixed in advance with a filler therein are available on the market in the forms of a silicone rubber stock and a silicone rubber dispersion. In the case where it is preferable that a silicone rubber layer is obtained by a coating operation as in the invention, an RTV or LTV silicone rubber dispersion is preferably used. The examples thereof include, for example, the silicone rubber dispersions for paper coating such as Syl Off 23, SRX-257 and SH237, manufactured by Toray Silicone Co.

In the invention, it is preferable to use a condensation cross coupling type silicone rubber.

For further improving the adhesive property, it is preferable to contain a silane coupling agent having an amino group into a silicone rubber layer.

The preferable silane coupling agents include, for example;

(a) H$_2$NCH$_2$CH$_2$NH(CH$_2$)$_3$Si(OCH$_3$)$_3$,
(b) H$_2$NCE$_2$CH$_2$NH(CH$_2$)$_3$Si(OCH$_3$)$_2$(CH$_3$), and
(c) H$_2$N(CH$_2$)$_3$Si(OEt)$_3$ The silicone rubber layer applicable to the invention is further allowed to contain a small amount of a photosensitizer.

The silicone rubber layer applicable to the invention is coated and then dried on a light-sensitive layer, after the silicone rubber is dissolved in a suitable solvent.

The support of the invention should preferably have a flexibility suitable for setting it to an ordinary lithographic printer and a resistance against a load applied when carrying out a printing operation. The supports include, for example, a sheet of metal, paper, plastic film or glass, each plated or vacuum evaporated thereon with a metal such as chromium, zinc, copper, nickel, aluminium and iron; and a sheet of paper coated with a resin or pasted with a foil of a metal such as aluminium. Among them, one of the preferable supports is an aluminium plate.

There is no special limitation to the treatments on the supports themselves for improving the above-mentioned adhesive property thereof, and the treatments include, for example, a variety of the surface roughening treatments.

The supports are allowed each to have a primer layer. The primer layers include, for example, those of a polyester resin, a vinyl chloride-vinyl acetate copolymer, an acryl resin, a vinyl chloride resin, a polyamide resin, a polyvinyl butyral resin, an epoxy resin, an acrylate type copolymer, a vinyl acetate type copolymer, a phenoxy resin, a polyurethane resin, a polycarbonate resin, a polyacrylonitrile butadiene, and a polyvinyl acetate. The above-given primer layers may be added by a compound capable of producing an acid when the above-mentioned exposure is made, or a dye discolored or faded by an acid.

The anchoring agents constituting the above-mentioned primer layer include, for example, the above-mentioned silane coupling agent and a silicone primer and, besides, an organic titanate is also useful for this purpose.

The thicknesses of each layers constituting the lithographic plates of the invention are as follows: The thicknesses of the supports are within the range of 50 to 400 μm and, preferably, 100 to 300 μm; the thicknesses of the light-sensitive layers are within the range of 0.05 to 10 μm and, preferably, 0.5 to 5 μm; and the thicknesses of the silicone rubber layers are within the range of 0.1 to 10 μm and, preferably, 0.5 to 2 μm.

In the invention, if required, a protective layer may be provided onto the silicone rubber layer.

As the methods in which the above-mentioned light-sensitive lithographic printing plates are developed with the developer of the invention, it is allowed to use the methods such as a shower development method and a dipping development method, each having been well-known in the developments of light-sensitive lithographic printing plates such as a PS plate; provided, however, it is preferable to rub the plate surface with a brush or a sponge either in the course of a development or in one of the post processing steps of the development, such as a dyeing or washing step.

The developers are generally used with circulating them and replenishing a part of them when it is fatigued. On the other hand, there is also a method in which a substantially fresh developer is supplied onto a plate every time when processing light-sensitive lithographic plates to develop the plate and the developer is then throw it away.

The developing temperatures are within the range of 15.C to 45° C. and, preferably, 25° C. to 35° C. The developing time is within the range of 15 seconds to 150 seconds and, preferably, 20 seconds to 60 seconds.

EXAMPLES

Now, the invention will be detailed with reference to the following examples. It is, however, to be understood that the invention shall not be limited thereto.

EXAMPLES 1 TO 6 AND COMPARATIVE EXAMPLES 1 TO 3

The following primer layer was coated on a 0.3 μm-thick aluminium plate and was then heat-treated at 200° C. for 2 minutes, so that a primer layer having a dried thickness of 3 μm could be prepared.

| Composition of the primer layer | |
|---|---|
| Polyurethane resin, Sanprene LQ-T 1331, manufactured by Sanyo Kasei Industries Co. | 100 wt. parts |
| Block isocyanate, Takenate B 830, manufactured by Takeda Pharmaceutical Industrial Co. | 20 wt. parts |
| Epoxy.phenol.urea resin, ST 9372, manufactured by Kansai Paint Co. | 8 wt. parts |
| Dimethylformamide | 725 wt. parts |

On the resulting primer layer, the following light-sensitive layer was successively coated so that the light-sensitive layer could be 2 μm in dry thickness.

| Composition of light-sensitive layer | |
|---|---|
| Hexafluorophosphate of the paraformaldehyde condensate of p-diazodiphenyl amine | 0.5 wt. parts |
| A copolymer of N-(4-hydroxyphenyl)meth-acrylamide: acrylonitrile: ethylacrylate: methacrylic acid = 27:33:41:6 in the ratio by weight; Acid value = 80 | 5 wt. parts |
| Tartaric acid | 0.05 wt. parts |
| Victoria Pure Blue BOH, a dye, manufactured by Hodogaya Chemical Industries Co. | 0.1 wt. parts |

Next, a 10% n-hexane dilluted silicone solution having the following composition was coated on the light-sensitive layer so that the dry thickness of the coat could be 2 μm.

| Silicone rubber layer | |
|---|---|
| Dimethyl polysiloxane, having a molecular weight of about 80000 | 100 wt. parts |
| Methyltriacetoxy silane | 5 wt. parts |
| Tin dibutylacetate | 0.2 wt. parts |

An original document film was brought into close contact with the resulting plate, and it was exposed to a 2 KW high-pressure mercury vapour lamp for 30 seconds.

Next, the resulting printing plate was rubbing-developed with a sponge and with the developer shown in Table-1, until an image was reproduced. The results thereof are shown in Table -1.

TABLE 1

| | | Composition of Developer | Part by weight | Developing time required |
|---|---|---|---|---|
| Invention | Inventive Example-1 | Potassium sulfite | 2.5 | 4.8 minutes |
| | | Benzoic acid | 3.0 | |
| | | Potassium hydroxide | 1.5 | |
| | | Water | 93.0 | |
| | Inventive Example-2 | Sodium dibutylnaphthalenesulfonate | 2.5 | 4.5 minutes |
| | | Benzoic acid | 3.0 | |
| | | Potassium hydroxide | 1.5 | |
| | | Water | 93.0 | |
| Invention | Inventive Example-3 | Sodium dibutylnaphthalenesulfonate | 2.5 | 3.8 minutes |
| | | p-tert-butylbenzoate | 3.0 | |
| | | Potassium hydroxide | 1.5 | |
| | | Water | 93.0 | |
| | Inventive Example-4 | Sodium dibutylnaphthalenesulfonate | 2.5 | 5.5 minutes |
| | | Caprylic acid | 3.0 | |
| | | Potassium hydroxide | 1.5 | |
| | | Water | 93.0 | |
| | Inventive Example-5 | Sodium laurylsulfate | 1.8 | 4.0 minutes |
| | | Sodium 2-hydroxy-3-naphthoate | 3.0 | |
| | | Benzyl alchohol | 0.4 | |
| | | Potassium hydroxide | 0.8 | |
| | | Water | 94.0 | |
| | Inventive Example-6 | Polyoxyethylene lauryl ether | 0.1 | 3.0 minutes |
| | | p-tert-butylbenzoate | 1.4 | |
| | | Potassium hydroxide | 1.0 | |
| | | Potassium sulfite | 2.0 | |
| | | Potassium metasilicate | 3.0 | |
| | | Water | 92.5 | |
| Comparison | Comparative Example-1 | p-tert-butylbenzoate | 3.0 | 7.0 minutes |
| | | Potassium hydroxide | 1.5 | |
| | | Water | 95.5 | |
| | Comparative Example-2 | Sodium dibutylnaphthalenesulfonate | 3.0 | 7.0 minutes |
| | | Potassium hydroxide | 0.7 | |
| | | Water | 96.3 | |
| | Comparative Example-3 | Potassium sulfite | 3.0 | 7.5 minutes |
| | | Potassium hydroxide | 0.3 | |
| | | Water | 96.3 | |

As is obvious from Table-1, the developer No. 1 to 6 of the invention have almost no odor and are high in safety, because they do not contain any organic solvent. They are also high in development rate, although they are of the aqueous type. On the other hand, the developer No. 1 to No. 3 of the comparative examples are not satisfactory in development rate and not suitable for a mass and continuous processing treatment, though they have a cold odor and are good in safety.

EXAMPLE 7

An original document film was superposed on the same waterless printing plate as used in Example 1 and an exposure was then made for 50 seconds to a 3 KW metal halide lamp from a distance of 70 cm. Next, the exposed light-sensitive lithographic printing plate was processed at random for 50 seconds with the following developer B. When trying a printing operation by putting the resulting light-sensitive lithographic printing plate on a printer, an excellent printed matter without having any stained background could be obtained.

| Developer B | |
|---|---|
| Propylene glycol | 10 wt. parts |
| β-anilinoethanol | 1 wt. part |
| p-tert-butylbenzoate | 3 wt. parts |
| Emulgen 147, a nonionic surfactant, manufactured by Kao Corporation | 0.1 wt. parts |
| Potassium sulfite | 2 wt. parts |
| An aqueous potassium silicate solution, having a SiO$_2$ content of 26 wt % and a K$_2$O content of 14 wt % | 2 wt. parts |
| Potassium hydroxide | 2 wt. parts |
| Water | 80 wt. parts |

What is claimed is:

1. A method of developing a waterless light-sensitive lithographic printing plate having a support and, provided thereon, a light-sensitive layer comprising a diazo resin and a silicone gum layer with a developer, wherein said developer comprises an aqueous solution containing a silicate in an amount of from 0.1 to 20 wt %, an aromatic carboxylic acid or salt thereof having 6 to 20 carbon atoms in an amount of from 0.1 to 10 wt.%, a sulfite in an amount of from 0.1 to 10 wt. %, and a surfactant.

2. The method of claim 1, wherein said developer has a pH of not less than 10.

3. The method of claim 1, wherein said sulfite includes sodium sulfite, potassium sulfite, lithium sulfite, and ammonium sulfite.

4. The method of claim 1, wherein said surfactant is a nonionic surfactant.

5. The method of claim 4, wherein said nonionic surfactant is a polyethylene glycol.

6. The method of claim 4, wherein said nonionic surfactant is a polyethylene glycol having three or more ethylene oxide groups and an HLB value of 5 to 20.

7. The method of claim 4, wherein said nonionic surfactant is a polyethylene glycol having an ethylene oxide group and a propylene oxide group and a HLB value of 8 to 20.

8. The method of claim 4, wherein said nonionic surfactant is contained in the developer in an amount within the range of 0.001 to 20% by weight.

9. The method of claim 4, wherein said nonionic surfactant is contained in the developer in an amount within the range of 0.1 to 10% by weight.

10. The method of claim 1, wherein said aqueous solution contains an amount of water within the range of 20 to 97% by weight.

11. The method of claim 1, wherein said aqueous solution contains an amount of water within the range of 50% to 95% by weight.

12. The method of claim 1, wherein said developer further contains an organic solvent in an amount within the range of 0.1 to 20% by weight.

13. The method of claim 12, wherein said organic solvent is benzyl alcohol or propylene glycols.

14. The method of claim 1, wherein said developer contains said carboxylic acid or salt thereof in an amount within the range of 0.5 to 4% by weight.

15. The method of claim 1, wherein said surfactant is an anionic surfactant.

16. The method of claim 15, wherein said anionic surfactant is contained in the developer in an amount within the range of 1 to 30% by weight.

17. The method of claim 15, wherein said anionic surfactant is contained in the developer in an amount within the range of 3 to 15% by weight.

* * * * *